United States Patent
Jia

(10) Patent No.: US 12,267,115 B2
(45) Date of Patent: Apr. 1, 2025

(54) PHASE DETERMINATION METHOD AND APPARATUS, PHASE CALIBRATION METHOD, MEDIUM AND ANTENNA DEVICE

(71) Applicant: SANECHIPS TECHNOLOGY CO., LTD., Guangdong (CN)

(72) Inventor: Chengwei Jia, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 267 days.

(21) Appl. No.: 18/013,937

(22) PCT Filed: Jun. 21, 2021

(86) PCT No.: PCT/CN2021/101208
§ 371 (c)(1),
(2) Date: Dec. 30, 2022

(87) PCT Pub. No.: WO2022/001721
PCT Pub. Date: Jan. 6, 2022

(65) Prior Publication Data
US 2023/0299857 A1    Sep. 21, 2023

(30) Foreign Application Priority Data
Jun. 30, 2020 (CN) .......................... 202010618636.8

(51) Int. Cl.
*H04B 17/00* (2015.01)
*H04B 17/12* (2015.01)
*H04B 17/14* (2015.01)
(Continued)

(52) U.S. Cl.
CPC ......... *H04B 17/0085* (2013.01); *H04B 17/12* (2015.01); *H04B 17/14* (2015.01); *H04B 17/221* (2023.05)

(58) Field of Classification Search
CPC .... H04B 17/0085; H04B 17/12; H04B 17/14; H04B 17/221; H04B 17/104; H04B 17/21; H04B 17/101; G01R 21/06; H01Q 3/267
(Continued)

(56) References Cited

U.S. PATENT DOCUMENTS

2007/0027649 A1* 2/2007 Chang .................... H04B 17/21
702/106
2008/0182537 A1* 7/2008 Manku .................... H04B 1/12
455/226.1
(Continued)

FOREIGN PATENT DOCUMENTS

CN      109361064 A    2/2019
EP      3664322 A1     6/2020

OTHER PUBLICATIONS

Indian Patent Office, first Office action dated Sep. 4, 2024, for corresponding IN application No. 202317003676.
(Continued)

*Primary Examiner* — Don N Vo
(74) *Attorney, Agent, or Firm* — Li & Cai Intellectual Property (USA) Office

(57) ABSTRACT

The present disclosure provides a method for determining a target initial phase, including: acquiring a voltage amplitude of a system direct-current offset signal of a phased array system corresponding to N target channels to be calibrated; respectively acquiring voltage amplitudes of a total direct-current offset signal under different initial phases; and calculating voltage amplitudes of a mixed direct-current offset signal of the N target channels under the different initial phases, and taking an initial phase of the N target channels, when the voltage amplitude of the mixed direct-current offset signal reaches the maximum value, as a target initial phase of the N target channels. The present disclosure
(Continued)

further provides a phase calibration method, an apparatus for determining an initial phase, and an antenna system.

13 Claims, 8 Drawing Sheets

(51) Int. Cl.
  *H04B 17/21* (2015.01)
(58) Field of Classification Search
  USPC ........................................ 455/67.16
  See application file for complete search history.

(56) References Cited

U.S. PATENT DOCUMENTS

| | | | |
|---|---|---|---|
| 2010/0273439 A1* | 10/2010 | Kawai | ................ H04L 25/06 455/113 |
| 2011/0122016 A1 | 5/2011 | Lomes et al. | |
| 2014/0153618 A1* | 6/2014 | Al-Qaq | ................ H04B 1/0475 375/219 |
| 2014/0161208 A1* | 6/2014 | Lim | ................ H04B 1/0475 375/297 |
| 2017/0285143 A1 | 10/2017 | Yagishita | |
| 2019/0128954 A1* | 5/2019 | Chen | ................ H01L 22/20 |

OTHER PUBLICATIONS

Korean Patent Office, first Office action dated Jun. 21, 2024, for corresponding KR application No. 10-2023-7001861.

European Patent Office, the Extended European Search Report dated Jul. 1, 2024, for corresponding EP application No. 21832242.8.

* cited by examiner

PHASE DETERMINATION METHOD AND APPARATUS, PHASE CALIBRATION METHOD, MEDIUM AND ANTENNA DEVICE

CROSS-REFERENCE TO RELATED APPLICATIONS

The present disclosure is a National Phase Application filed under 35 U.S.C. 371 as a national stage of PCT/CN2021/101208, filed on Jun. 21, 2021, an application claiming the priority to Chinese Patent Application No. CN202010618636.8 filed on Jun. 30, 2020, the entire contents of which are incorporated herein by reference.

TECHNICAL FIELD

The present disclosure relates to the field of communication technology.

BACKGROUND

With capabilities of beam forming, beam scanning and the like, the phased array technology can obviously improve the signal-to-noise ratio and the sensitivity of a wireless communication system. Through the phased array technology, the requirements on the power and noise of a single channel in a phased array system can be reduced, thereby facilitating wide application of the phased array technology.

SUMMARY

The present disclosure provides a method for determining a target initial phase, including: acquiring a voltage amplitude of a system direct-current offset signal of a phased array system corresponding to N target channels to be calibrated; respectively acquiring voltage amplitudes of a total direct-current offset signal under different initial phases, wherein for any initial phase, the total direct-current offset signal is a total direct-current offset signal of an initial mixed signal output from a mixer downstream of a power combiner of the phased array system after test signals are provided for the N target channels; and calculating voltage amplitudes of a mixed direct-current offset signal of the N target channels under the different initial phases, and taking an initial phase of the N target channels, when the voltage amplitude of the mixed direct-current offset signal reaches the maximum value, as a target initial phase of the N target channels; wherein the voltage amplitude of the mixed direct-current offset signal is calculated by:

$$V_{dc}^{mix} = V_{dc}^{tot} - V_{dc}^{int};$$

where $V_{dc}^{int}$ is the voltage amplitude of the system direct-current offset signal; $V_{dc}^{tot}$ is the voltage amplitude of the total direct-current offset signal; $V_{dc}^{mix}$ is the voltage amplitude of the mixed direct-current offset signal; and N is the number of channels in the phased array system.

The present disclosure provides a phase calibration method, including: generating a system direct-current offset signal of a phased array system corresponding to N target channels to be calibrated, and outputting a voltage amplitude of the system direct-current offset signal; adjusting initial phases of the N target channels, wherein each time the initial phases of the N target channels are adjusted to another phase value, test signals are provided for the N target channels so that a mixer downstream of a power combiner of the phased array system outputs a total direct-current offset signal, as well as a voltage amplitude of the total direct-current offset signal; determining, with the method for determining a target initial phase according to the present disclosure, a target initial phase of the N target channels; and respectively adjusting the initial phases of the target channels to the target initial phase.

The present disclosure provides an apparatus for determining a target initial phase, including: a memory module having a computer program stored thereon, and one or more processors which invoke the computer program to implement the method for determining a target initial phase according to the present disclosure.

The present disclosure provides a computer-readable storage medium having a computer program stored thereon which, when invoked by a processor, causes the processor to implement the method for determining a target initial phase according to the present disclosure.

The present disclosure provides an antenna device, including: a phased array system; and a target initial phase determining apparatus according to the present disclosure.

BRIEF DESCRIPTION OF DRAWINGS

Accompanying drawings are provided for further understanding of this disclosure and constitute a part of the specification. Hereinafter, these drawings are intended to explain the present disclosure together with the following specific implementations, but should not be considered as a limitation to the present disclosure. In the drawings.

DETAIL DESCRIPTION OF EMBODIMENTS

Hereinafter, specific implementations of the present disclosure will be described with respect to the accompanying drawings. It will be appreciated that the specific implementations as set forth herein are merely for the purpose of illustration and explanation of the present disclosure and should not be constructed as a limitation thereof.

Figure 1:
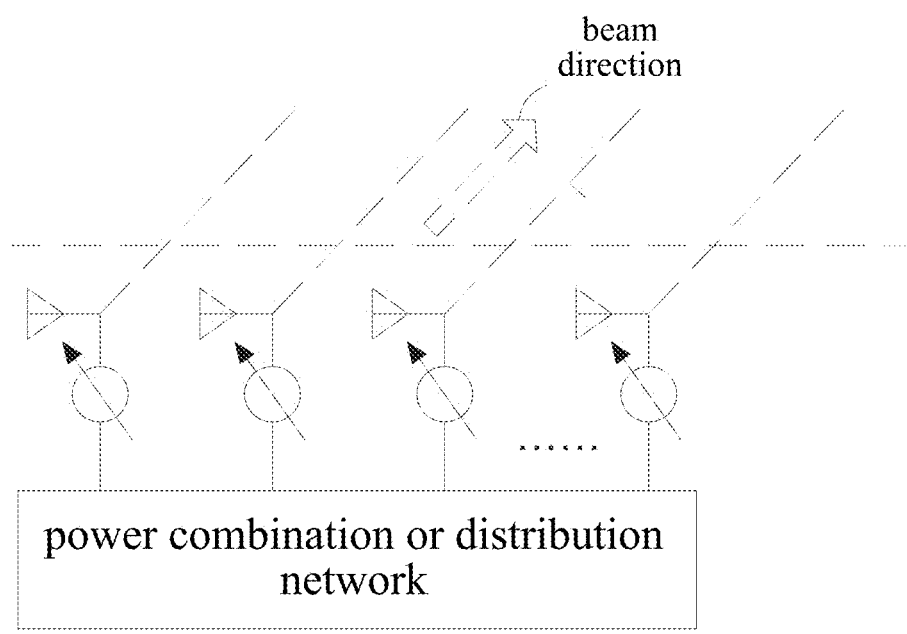
FIG. 1 is a framework diagram of a phased array system in the related art.

FIG. 1 is a framework diagram of a phased array system in the related art. As shown in FIG. 1, a power combination or distribution network distributes power to each channel, and by means of a controllable phase difference of different channels, the beam pointing can be changed and effective beam forming can be performed. However, due to a relatively large number of channels in the phased array system, it is difficult to guarantee that all channels has a same initial phase because different channels differ from each other in the processing and manufacturing and in the ambient environment, leading to reduced beam forming performance. Therefore, how to calibrate phases of channels in the phased array system has become a technical problem to be solved in the field.

Figure 3:
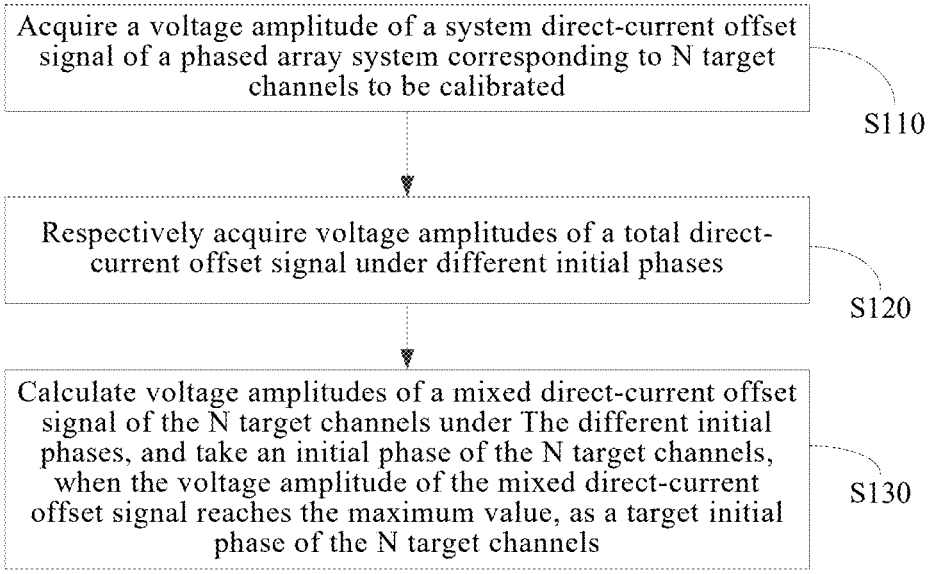
FIG. 3 is a flowchart of an implementation of a method for determining a target initial phase according to the present disclosure.

The present disclosure provides a method for determining a target initial phase. As shown in FIG. 3, the method for determining a target initial phase includes the following operations S110 to S130.

At S110, acquiring a voltage amplitude of a system direct-current offset signal of a phased array system corresponding to N target channels to be calibrated.

At S120, respectively acquiring voltage amplitudes of a total direct-current offset signal under different initial phases. For any initial phase, the total direct-current offset signal is a total direct-current offset signal of an initial mixed signal output from a mixer downstream of a power combiner of the phased array system after test signals are provided for the N target channels.

At S130, calculating voltage amplitudes of a mixed direct-current offset signal of the N target channels under the different initial phases, and taking an initial phase of the N target channels, when the voltage amplitude of the mixed direct-current offset signal reaches the maximum value, as a target initial phase of the N target channels.

The voltage amplitude of the mixed direct-current offset signal is calculated by the following formula (1):

$$V_{dc}^{mix} = V_{dc}^{tot} - V_{dc}^{int} \quad (1)$$

where $V_{dc}^{int}$ is the voltage amplitude of the system direct-current offset signal; $V_{dc}^{tot}$ is the voltage amplitude of the total direct-current offset signal; $V_{dc}^{mix}$ is the voltage amplitude of the mixed direct-current offset signal; and N is the number of channels in the phased array system.

It should be noted that the "respectively acquiring voltage amplitudes of a total direct-current offset signal under different initial phases" herein means that each time the voltage amplitude of the total direct-current offset signal is acquired, the N target channels have a same initial phase.

Figure 2:
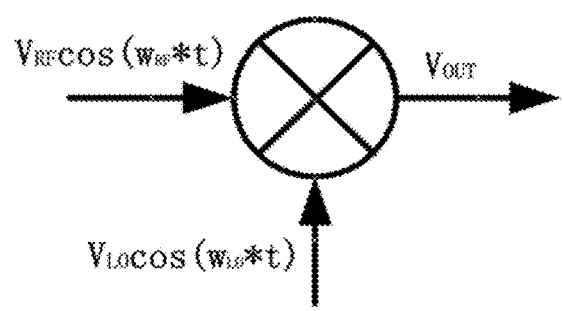
FIG. 2 is a schematic diagram of a mixer.

The method for determining a target initial phase of the present disclosure is a mixer principle-based method. The principle of the mixer is briefly explained below with reference to FIG. 2.

The mixer is equivalent to an analog multiplier. Assuming that a gain of the mixer is $A_{MIXER}$, then the output signal of the mixer is as shown in formula (2):

$$V_{out} = A_{MIXER} * V_{RF} \cos(w_{RF} t + \varphi_{RF}) * V_{LO} \cos(w_{LO} t + \varphi_{LO}) \quad (2)$$

$$= \frac{1}{2} A_{MIXER} * V_{RF} V_{LO}$$

$$[\cos(w_{RF} t + w_{LO} t + \varphi_{RF} + \varphi_{LO}) + \cos(w_{RF} t - w_{LO} t + \varphi_{RF} - \varphi_{LO})]$$

where $V_{RF}$ is a voltage amplitude of a radio frequency (RF) signal; $V_{LO}$ is a voltage amplitude of a local oscillator signal; $w_{RF}$ is an angular frequency of the RF signal; $w_{LO}$ is an angular frequency of the local oscillator signal; $\varphi_{RF}$ is a phase of the RF signal; and $\varphi_{LO}$ is a phase of the local oscillator signal.

The first equation in formula (2) shows that a basic mathematical principle of the mixing by the mixer is multiplying two signals, and then converting the product to the second equation in formula (2) through the prosthaphaeresis formula, namely, calculating a sum or difference in frequency domain.

A low-pass filter is typically provided at an output end of the mixer to filter out a high-frequency term in formula (2), and obtained an output signal as shown in formula (3):

$$V_{OUT} = \frac{1}{2} A_{MIXER} * V_{RF} V_{LO} \cos(w_{RF} t - w_{LO} t + \varphi_{RF} - \varphi_{LO}) \quad (3)$$

The formula (3) shows acquiring a difference frequency signal generated by mixing, where the frequency of the difference frequency signal is a difference between frequencies of the two mixed signals, and the initial phase is a difference between initial phases of the two mixed signals.

If the input signal has the same frequency as the local oscillator signal, then the signal output from the mixer is a direct-current signal, and an amplitude $V_{OUT}'$ of the direct-current signal is calculated by formula (4):

$$V_{OUT}' = \frac{A_{MIXER} * V_{RF} V_{LO}}{2} \cos(\varphi_{RF} - \varphi_{LO}) \quad (4)$$

As can be seen from formula (4), if the two mixed signals has a same frequency, the final output after mixing is a direct-current component which has a magnitude associated with initial phases of the two mixed signals. When the two mixed signals has a same initial phase, the direct-current component output from the mixer reaches a maximum value.

After receiving a test signal, each target channel may process (e.g., amplify) the test signal, and then, the power combiner superimposes signals output from multiple target channels. Since different target channels have different initial phases, the final superimposed signal y is as shown in formula (5):

$$y = \sum_{i=1}^{N} A_i * \cos(w * t + \varphi_i) \quad (5)$$

where i is a serial number of a target channel, i is a variable, and is a positive integer satisfying $1 \leq i \leq N$; $A_i$ is a gain of the $i^{th}$ target channel; w*t represents a periodic function; and $\varphi_i$ is an initial phase of the $i^{th}$ target channel.

A signal obtained by mixing the superimposed signal y in the mixer may be expressed by formula (6):

$$V_{out}^{mix} = y * B * \cos(w * t + \varphi_0) \quad (6)$$

$$= \left[ \sum_{i=1}^{N} A_i * \cos(w * t + \varphi_i) \right] * B * \cos(w * t + \varphi_0)$$

where B is the voltage amplitude of the local oscillator signal; w is the angular frequency of the local oscillator signal; and $\varphi_0$ is the phase of the local oscillator signal.

After the high-frequency signal is filtered by the low-pass filter, the remaining direct-current offset signal (i.e., the total direct-current offset signal) is as shown in formula (7):

$$V_{dc}^{mix} = \frac{B}{2}\sum_{i=1}^{N}A_i * \cos(\varphi_i - \varphi_0) \qquad (7)$$

If the signal in the target channel has the same frequency as the local oscillator signal, and after the high-frequency signal is filtered out, the remaining difference frequency signal is a direct-current component, when the initial phase $\varphi_i$ (i=1, 2, 3 ... N) contained in each cosine signal function is the same as the initial phase of the local oscillator signal, the direct-current component reaches a maximum value.

The mixed direct-current offset signal generated after the mixing in the mixer is superimposed with the initial system direct-current offset signal of the phased array system (i.e., the system direct-current offset signal obtained in operation S110) to obtain the total direct-current offset signal of the phased array system. Therefore, when determining the direct-current offset signal (i.e., the mixed direct-current offset signal) generated from the mixed signal of the test signal in each channel, the initial system direct-current offset signal needs to be subtracted from the obtained total direct-current offset signal output from the analog-to-digital converter, thus the mixed direct-current offset signal is calculated from above formula (1).

The mixed direct-current offset signal $V_{dc}^{mix}$ in formula (1) is the optimization target used for adjusting the phase of each channel. When the mixed direct-current offset signal $V_{dc}^{mix}$ reaches the maximum value, it indicates that all channels has a same initial phase equal to the initial phase of the local oscillator signal.

In the related art, a coupler is usually added to an antenna end of the phased array system to perform initial phase calibration of channels in combination with phase discrimination. In this manner, a coupler is desired to be introduced into each antenna port, and the scheme is complex due to complex signal traces from the coupler to the phase discriminator. In addition, inconsistency of the large number of traces between the coupler and the phase discriminator may cause calibration deviations, and thus reduce the calibration accuracy. According to the method for determining a target initial phase of the present disclosure, signals of the channels in the phased array system are each subjected to self-mixing in the mixer to obtain the target initial phase of each target channel, thereby simplifying the calibration process. In addition, since no additional calibration device is desired, no additional calibration deviation is introduced, and the calibration accuracy is thus improved.

The target channel may be a receiving channel or a transmitting channel. The following describes the method for determining a target initial phase of the present disclosure in detail under the two cases, i.e., the target initial phase is a receiving channel and the target channel is a transmitting channel, respectively.

When the target channel is a receiving channel, the voltage amplitude of the system direct-current offset signal in operation S110 may be obtained by: opening N receiving channels; and determining an output value of an analog-to-digital converter (ADC) of the phased array system as the voltage amplitude of the system direct-current offset signal.

In other words, the voltage amplitude of the system direct-current offset signal in operation S110 is an output value of the ADC downstream of the mixer after the N receiving channels are opened.

It should be noted that when the receiving channels are opened, the N target channels are opened without any external input applied on the phased array system. In addition, the obtained voltage amplitude of the initial system direct-current offset signal is a voltage amplitude corresponding to a sum of direct-current offset signals generated by all devices (for example, a transimpedance amplifier, a filter, etc.) from the mixer to the ADC of the phased array system, as well as a voltage amplitude of the system direct-current offset signal of the phased array system.

Further, the test signals are not particularly limited in the present disclosure. In the case where the target channel is a receiving channel, as an optional implementation, the test signals may be single tone signals transmitted from a transmitter antenna of a single channel used for calibration.

Accordingly, in operation S120, the voltage amplitude of the total direct-current offset signal is an output value of the ADC after the N receiving channels are opened.

When the target channel is a transmitting channel, the voltage amplitude of the system direct-current offset signal in operation S110 is an output value of an ADC downstream of the mixer after a receiving channel for calibration is opened.

The test signals are not particularly limited in the present disclosure. As an optional implementation, the test signals provided for the N target channels may be single tone signals transmitted through a multi-channel transmitter antenna of the phased array system.

Accordingly, in operation S120, the voltage amplitude of the total direct-current offset signal is an output value of the ADC after the receiving channel for calibration is opened.

Figure 4:
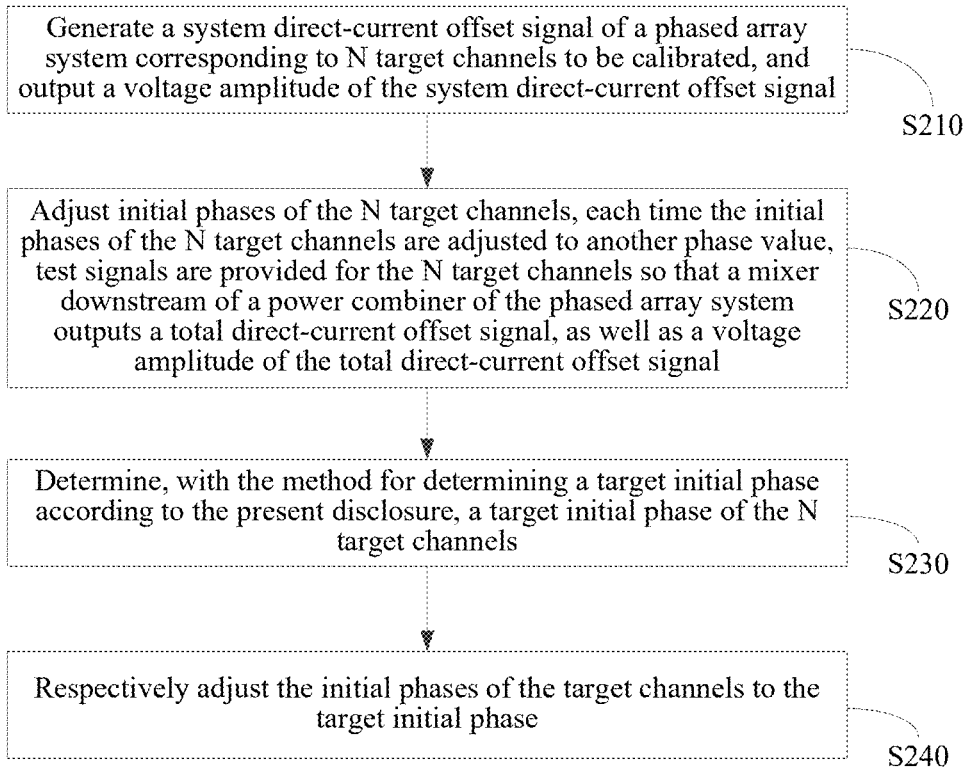
FIG. 4 is a flowchart of an implementation of a phase calibration method according to the present disclosure.

The present disclosure provides a phase calibration method. As shown in FIG. 4, the phase calibration method includes the following operations S210 to S240.

At S210, generating a system direct-current offset signal of a phased array system corresponding to N target channels to be calibrated, and outputting a voltage amplitude of the system direct-current offset signal.

At S220, adjusting initial phases of the N target channels, wherein each time the initial phases of the N target channels are adjusted to another phase value, test signals are provided for the N target channels so that a mixer downstream of a power combiner of the phased array system outputs a total direct-current offset signal, as well as a voltage amplitude of the total direct-current offset signal.

At S230, determining, with the method for determining a target initial phase according to the present disclosure, a target initial phase of the N target channels.

At S240, respectively adjusting the initial phases of the target channels to the target initial phase.

According to the phase calibration method of the present disclosure, signals of the channels in the phased array system are each subjected to self-mixing in the mixer to obtain the target initial phase of each target channel, thereby simplifying the calibration process. In addition, since no additional calibration device is desired, no additional calibration deviation is introduced, and the calibration accuracy is thus improved.

In the present disclosure, how to adjust the phase of each target channel in operation S220 is not particularly limited. Each channel in the phased array system corresponds to a phase shifter that may be configured to adjust the phase of each target channel.

As described above, the target channel may be a receiving channel or a transmitting channel. The following describes the phase calibration method in the cases where the target channel is a receiving channel and where the target channel is a transmitting channel.

Figure 5:
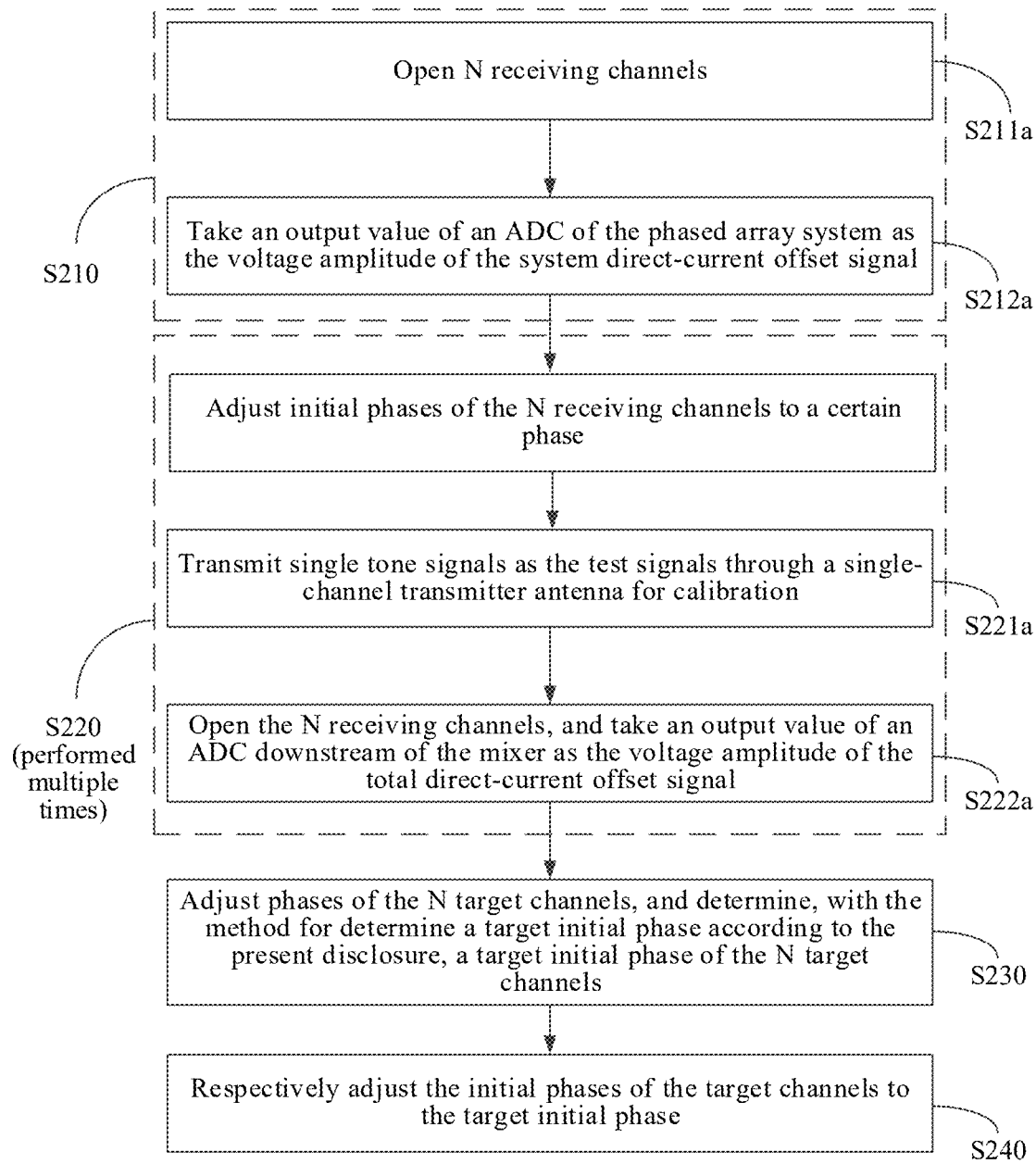
FIG. 5 is a flowchart of calibrating receiving channels with the phase calibration method according to the present disclosure.

When the target channel is a receiving channel, as shown in FIG. 5, operation S210 may include the following operations S211a to S212a.

At S211a, opening N receiving channels.

At S212a, taking an output value of an ADC of the phased array system as the voltage amplitude of the system direct-current offset signal.

The test signals are not particularly limited in the present disclosure. As an optional implementation, as shown in FIG. 5, operation S220 may include the following operations S221a to S222a.

At S221a, transmitting single tone signals as the test signals through a single-channel transmitter antenna for calibration.

At S222a, opening the N receiving channels, and taking an output value of an ADC downstream of the mixer as the voltage amplitude of the total direct-current offset signal.

Figure 6:
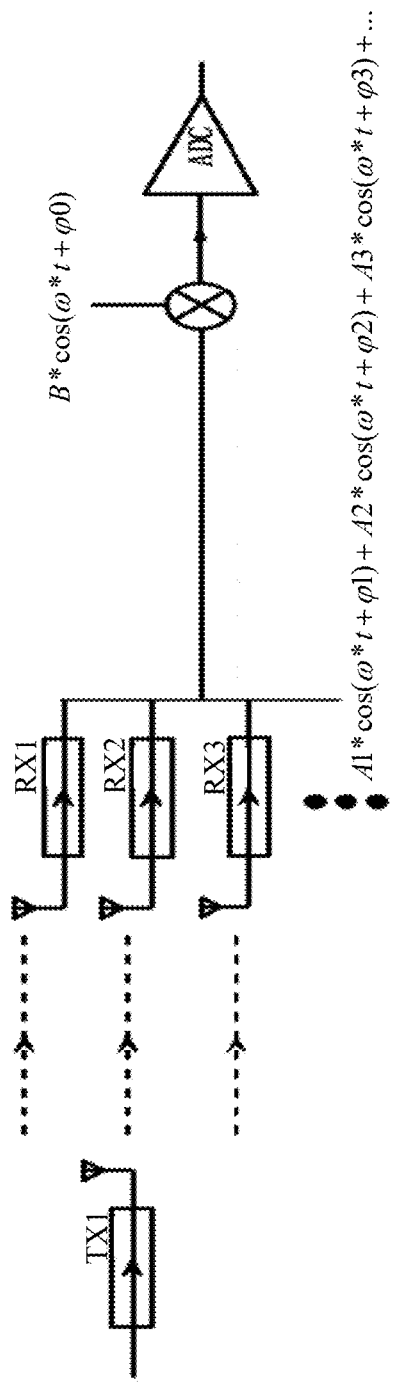
FIG. 6 is an architecture diagram of calibrating receiving channels with the phase calibration method according to the present disclosure.

The calibration method for receiving channels is further described in detail below with reference to FIGS. 5 and 6.

At S211a, opening all receiving channels without any external input to the phased array system.

At S212a, recording a voltage amplitude of the direct-current offset signal measured at an output end of the ADC at this time. This direct-current offset signal is the system direct-current offset signal. For convenience of distinguishing from the calibration of transmitting channels, the system direct-current offset signal is referred to herein as $V_{dc}^{initRX}$. A direct-current offset corresponding to this direct-current offset signal is a sum of direct-current offsets generated by all devices from the mixer to the ADC.

At S221a, transmitting single tone signals through a single-channel transmitter antenna for calibration so that the receiving channels $RX_1, RX_2, RX_3, \ldots, RX_n$ of the phased array system respectively receive the single tone signals in phase and with equal magnitudes.

At S222a, finally superimposing amplifications of the channels at the power combiner. Since different receiving channels have different initial phases, the finally superimposed signal may be represented by the above formula (5):

$$y = A_1 * \cos(w*t+\varphi_1) + A_2 * \cos(w*t+\varphi_2) + \ldots + A_n * \cos(w*t+\varphi_n) \quad (5)$$

The formula (5) shows that the signal at the power combiner is a superposition of the signals received by the receiving channels after channel amplification and initial phase adjustment.

The signal generated by mixing in the mixer may be expressed by the above formula (6):

$$V_{out}^{mix} = y * B * \cos(w*t+\varphi_0) \quad (6)$$
$$= \begin{bmatrix} A_1 * \cos(w*t+\varphi_1) + A_2 * \cos(w*t+\varphi_2) + \ldots + \\ A_n * \cos(w*t+\varphi_n) \end{bmatrix} * B * \cos(w*t+\varphi_0)$$

The formula (6) shows that based on the mixing principle of formula (2), the mixing of the output of the power combiner and the local oscillator signal of the mixer means multiplying a plurality of cosine signals by the local oscillator signal.

After the high-frequency signal is filtered by the low-pass filter, the voltage amplitude of remaining direct-current offset signal is expressed by the following formula (7):

$$V_{dc}^{mixRX} = \frac{B}{2} \sum_{i=1}^{N} A_i * \cos(\varphi_i - \varphi_0) \quad (7)$$

The above formula shows that the received signal has the same frequency as the local oscillator signal, and shows the remaining difference frequency signal after the high-frequency signal is filtered out. The difference frequency signal in this case is a direct-current component which reaches a maximum value when initial phases of all cosine signals are the same as the initial phase of the local oscillator signal.

The direct-current offset signal generated after the mixing in the mixer is superposed with the initial system direct-current offset signal, and then, the direct-current offset signal measured at the output end of the ADC is recorded as $V_{dc}^{totRX}$. Since the initial system direct-current offset is to be subtracted from the direct-current offset generated by mixing on this basis, so $V_{dc}^{mixRX} = V_{dc}^{totRX} - V_{dc}^{initRX}$.

At S230, setting the optimization target to $V_{dc}^{mixRX}$, and respectively adjusting phases of the receiving channels $RX_1$, $RX_2, RX_3, \ldots, RX_n$ (which may be specifically implemented by adjusting a phase shifter module in each receiving channel), until the optimization target $V_{dc}^{mixRX}$ reaches a maximum value. The condition for $V_{dc}^{mixRX}$ reaching the maximum value is shown in formula (8):

$$\begin{cases} \varphi_1 = \varphi_0 \\ \varphi_2 = \varphi_0 \\ \ldots \\ \varphi_N = \varphi_0 \end{cases} \quad (8)$$

The formula (8) shows that the condition for the direct-current component generated by mixing reaches the maximum value is that initial phases of all receiving channels are the same as the initial phase of the local oscillator signal. Therefore, the relationship is $\varphi_1 = \varphi_2 = \ldots = \varphi_N = \varphi_0$, thereby implementing phase calibration of each receiving channel in the phased array system, and ensuring that all receiving channels have a same initial phase.

At S240, respectively adjusting the initial phase of each target channel to a corresponding target initial phase.

Figure 7:
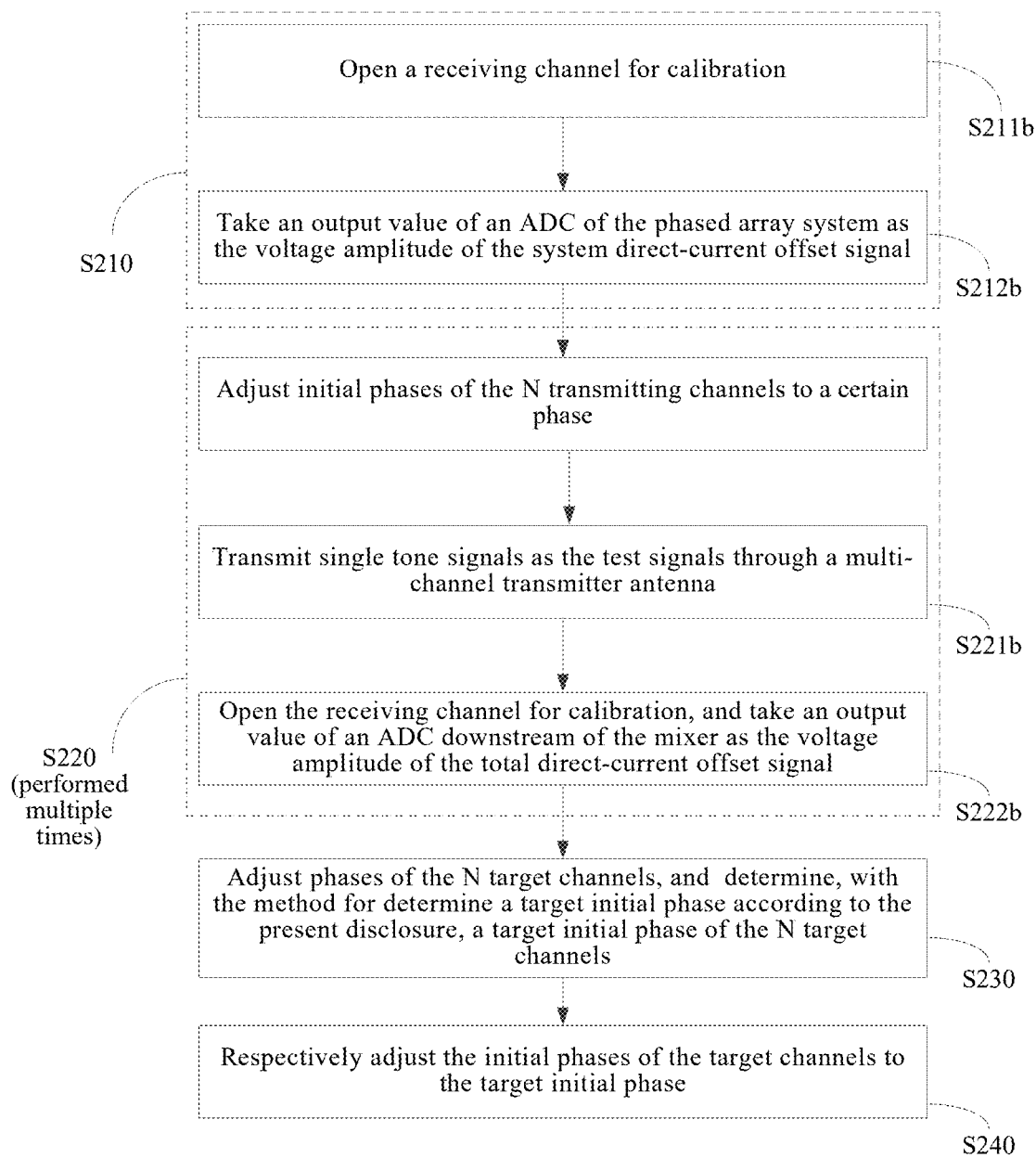
FIG. 7 is a flowchart of calibrating transmitting channels with the phase calibration method according to the present disclosure.

When the target channel is a transmitting channel, as shown in FIG. 7, operation S210 may include the following operations S211b to S212b.

At S211b, opening a receiving channel for calibration.

At S212b, taking an output value of an ADC of the phased array system as the voltage amplitude of the system direct-current offset signal.

In the present disclosure, how to provide the test signals is not particularly limited. Optionally, single tone signals transmitted through a multi-channel transmitter antenna may be used as the test signals. Specifically, as shown in FIG. 7, operation S220 may include the following operations S221b to S222b.

At S221b, transmitting single tone signals as the test signals through a multi-channel transmitter antenna.

At S222b, opening the receiving channel for calibration, and taking an output value of an ADC downstream of the mixer as the voltage amplitude of the total direct-current offset signal.

Figure 8:
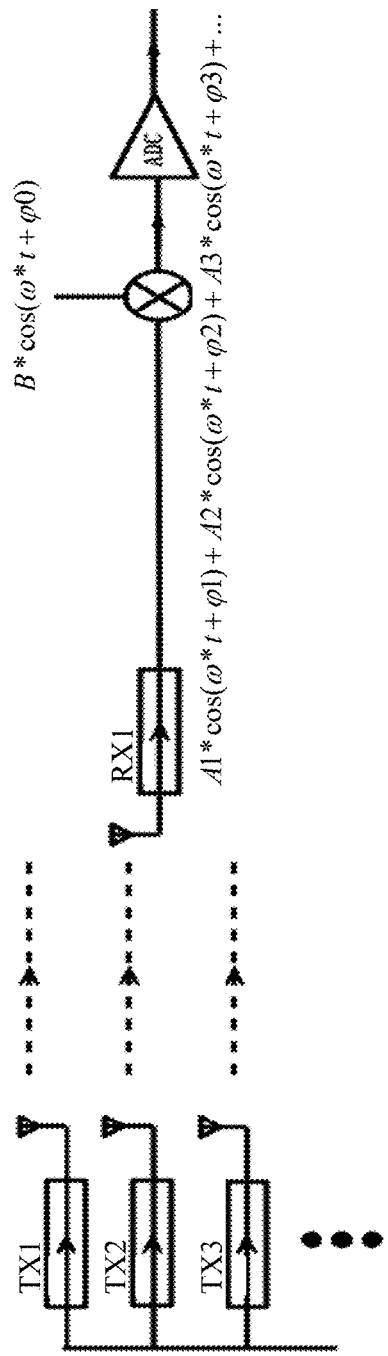
FIG. 8 is an architecture diagram of calibrating transmitting channels with the phase calibration method according to the present disclosure.

The calibration method for transmitting channels is further described in detail below with reference to FIGS. 7 and 8.

At S211b, opening the channels in the case where no external input is applied to the receiving channel for calibration.

At S212b, recording a voltage amplitude of the direct-current offset signal measured at an output end of the ADC at this time as $V_{dc}^{initTX}$. This direct-current offset signal corresponding a direct-current offset is a sum of direct-current offsets generated by all devices from the mixer to the ADC, which is a system direct-current offset signal from direct-current offset by the receiving channel for calibration.

At S221b, transmitting single tone signals through a multi-channel transmitter antenna of the phased array system.

In S222b, since different channels have different initial phases, the final superimposed signal at the input end of the mixer of the receiving channel for calibration is:

$$y = A_1 * \cos(w*t+\varphi_1) + A_2 * \cos(w*t+\varphi_2) + \ldots + A_n * \cos(w*t+\varphi_n)$$

The above formula shows that the signal before the mixer of the receiving channel for calibration is a superposition of signals from transmitting channels to be calibrated, which signals may have different amplitudes and initial phases, but have a same frequency.

The signal generated after the mixing in the mixer is:

$$V_{out}^{mix} = y * B * \cos(w*t + \varphi_0)$$
$$= [A_1 * \cos(w*t + \varphi_1) + A_2 * \cos(w*t + \varphi_2) + \ldots + A_n * \cos(w*t + \varphi_n)] *$$
$$B * \cos(w*t + \varphi_0)$$

The above formula shows that based on the mixing principle of formula (2), the mixing of the input of the mixer of the receiving channel for calibration and the local oscillator signal of the mixer means multiplying a plurality of cosine signals by the local oscillator signal.

After the high-frequency signal is filtered by the low-pass filter, the remaining direct-current offset signal is:

$$V_{dc}^{mixTX} =$$
$$\frac{B}{2} * [A_1 * \cos(\varphi_1 - \varphi_0) + A_2 * \cos(\varphi_2 - \varphi_0) + \ldots + A_n * \cos(\varphi_n - \varphi_0)]$$

The above formula shows that the transmitted signals have the same frequency as the local oscillator signal of the receiving channel for calibration, and shows the remaining difference frequency signal after the high-frequency signal is filtered out in the receiving channel for calibration. The difference frequency signal in this case is a direct-current component which reaches a maximum value when initial phases of all cosine signals are the same as the initial phase of the local oscillator signal.

The direct-current offset signal generated after the mixing in the mixer is superposed with the initial system direct-current offset signal, and then, the direct-current offset signal measured at the output end of the ADC is recorded as $V_{dc}^{totTX}$. Since the initial system direct-current offset is to be subtracted from the direct-current offset generated by mixing on this basis, so $V_{dc}^{mixTX} = V_{dc}^{totTX} - V_{dc}^{initTX}$.

At S230, setting the optimization target to $V_{dc}^{mixTX}$, and respectively adjusting phases of the transmitting channels $TX_1, TX_2, TX_3, \ldots, TX_n$ (which may be specifically implemented by adjusting a phase shifter module in each transmitting channel), until the optimization target $V_{dc}^{mixTX}$ reaches a maximum value. The condition for $V_{dc}^{mixTX}$ reaching the maximum value is:

$$\begin{cases} \varphi_1 = \varphi_0 \\ \varphi_2 = \varphi_0 \\ \ldots \\ \varphi_N = \varphi_0 \end{cases} \tag{9}$$

The formula (9) shows that the condition for the direct-current component generated by mixing reaches the maximum value is that initial phases of all transmitting channels are the same as the initial phase of the local oscillator signal.

Therefore, the relationship is $\varphi_1 = \varphi_2 = \ldots = \varphi_N = \varphi_0$, thereby implementing phase calibration of each transmitting channel in the phased array system, and ensuring that all transmitting channels have a same initial phase.

At S240, respectively adjusting the initial phase of each target channel to a corresponding target initial phase.

The phase calibration method of the present disclosure is described below taking the case where the number N of channels is 2 as an example.

Figure 9:
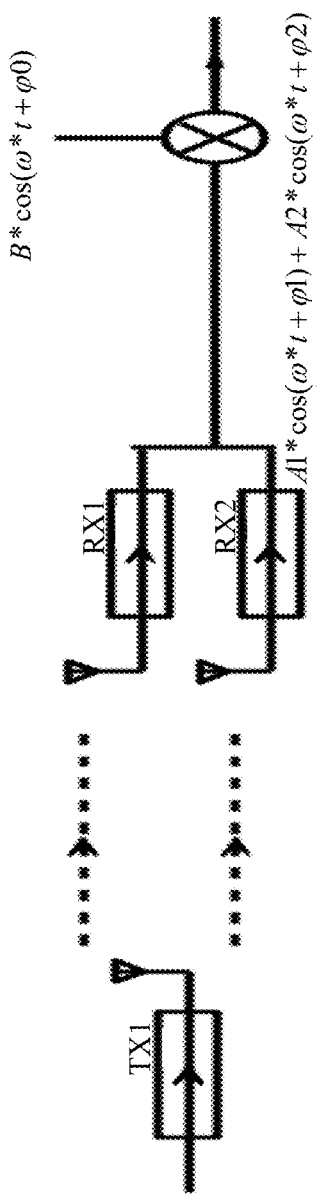
FIG. 9 is an architecture diagram of calibrating receiving channels in a dual channel phased array system with the phase calibration method according to the present disclosure.

The phase calibration method for receiving channels is described in detail below with reference to FIGS. 5 and 9.

At S211a, opening all receiving channels without any external input to a dual channel phased array system.

At S212a, recording a voltage amplitude of the direct-current offset signal measured at an output end of the ADC at this time as $V_{dc}^{initRX}$. This direct-current offset signal corresponding a direct-current offset is a sum of direct-current offsets generated by all devices from the mixer to the ADC, which is an initial value of the system direct-current offset signal.

At S221a, transmitting single tone signals through a single-channel transmitter antenna for calibration so that the receiving channels $RX_1$ and $RX_2$ of the dual channel phased array system receive the single tone signals in phase and with equal magnitudes.

At S222a, finally superimposing amplifications of the channels at the power combiner. Since different channels have different initial phases, the final superimposed signal is:

$$y = A_1 * \cos(w*t+\varphi_1) + A_2 * \cos(w*t+\varphi_2)$$

The above formula shows that the signal at the power combiner is a superposition of the signals received by the receiving channels after channel amplification and initial phase adjustment.

The signal generated after the mixing in the mixer is:

$$V_{out}^{mix} = y * B * \cos(w*t + \varphi_0)$$
$$= [A_1 * \cos(w*t + \varphi_1) + A_2 * \cos(w*t + \varphi_2)] *$$
$$B * \cos(w*t + \varphi_0)$$

The above formula shows that based on the mixing principle of formula (2), the mixing of the output of the power combiner and the local oscillator signal of the mixer means multiplying two cosine signals by the local oscillator signal.

After the high-frequency signal is filtered by the low-pass filter, the remaining direct-current offset signal is:

$$V_{dc}^{mixRX} = \frac{B}{2} * [A_1 * \cos(\varphi_1 - \varphi_0) + A_2 * \cos(\varphi_2 - \varphi_0)]$$

The above formula shows that the received signal has the same frequency as the local oscillator signal, and shows the remaining difference frequency signal after the high-frequency signal is filtered out. The difference frequency signal in this case is a direct-current component which reaches a maximum value when initial phases of the two cosine signals are both the same as the initial phase of the local oscillator signal.

The direct-current offset signal generated after the mixing in the mixer is superposed with the initial system direct-current offset signal, and then, the direct-current offset signal measured at the output end of the ADC is recorded as $V_{dc}^{totRX}$. Since the initial system direct-current offset is to be subtracted from the direct-current offset generated by mixing on this basis, so $V_{dc}^{mixRX} = V_{dc}^{totRX} - V_{dc}^{initRX}$.

At S230, setting the optimization target to $V_{dc}^{mixRX}$, and respectively adjusting phases of the receiving channels $RX_1$ and $RX_2$ (which may be specifically implemented by adjusting a phase shifter module in each receiving channel), until the optimization target $V_{dc}^{mixRX}$ reaches a maximum value. The condition for $V_{dc}^{mixRX}$ reaching the maximum value is:

$$\begin{cases} \phi_1 = \phi_0 \\ \phi_2 = \phi_0 \end{cases} \quad (10)$$

The formula (10) shows that the condition for the direct-current component generated by mixing reaches the maximum value is that initial phases of the two receiving channels are both the same as the initial phase of the local oscillator signal.

Therefore, the relationship is $\varphi_1 = \varphi_2 = \varphi_0$, thereby implementing phase calibration of each receiving channel in the dual channel phased array system, and ensuring that all receiving channels have a same initial phase.

At S240, adjusting initial phases of the two receiving channels to the phases determined in operation S230.

Figure 10:
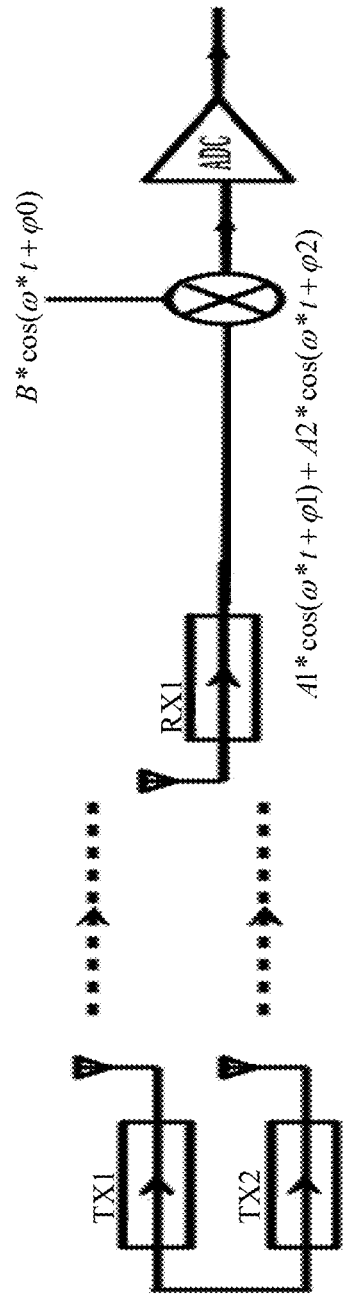
FIG. 10 is an architecture diagram of calibrating transmitting channels in a dual channel phased array system with the phase calibration method according to the present disclosure.

The phase calibration method for receiving channels is described in detail below with reference to FIGS. 7 and 10.

At S211b, opening the channels in the case where no external input is applied to a receiving channel for calibration.

At S212b, recording a voltage amplitude of the direct-current offset signal measured at an output end of the ADC at this time as $V_{dc}^{initTX}$. This direct-current offset signal corresponding a direct-current offset is a sum of direct-current offsets generated by all devices from the mixer to the ADC, which is a system direct-current offset signal from direct-current offset by the receiving channel for calibration.

At S221b, transmitting single tone signals through a dual channel transmitter antenna.

In S222b, since different channels have different initial phases, the final superimposed signal at the input end of the mixer of the receiving channel for calibration is:

$$y = A_1 * \cos(w*t + \varphi_1) + A_2 * \cos(w*t + \varphi_2)$$

The above formula shows that the signal before the mixer of the receiving channel for calibration is a superposition of signals from the two transmitting channels to be calibrated, which signals may have different amplitudes and initial phases, but have a same frequency.

The signal generated after the mixing in the mixer is:

$$\begin{aligned} V_{out}^{mix} &= y * B * \cos(w*t + \varphi_0) \\ &= [A_1 * \cos(w*t + \varphi_1) + A_2 * \cos(w*t + \varphi_2)] * \\ &\quad B * \cos(w*t + \varphi_0) \end{aligned}$$

The above formula shows that based on the mixing principle of formula (2), the mixing of the input of the mixer of the receiving channel for calibration and the local oscillator signal of the mixer means multiplying two cosine signals by the local oscillator signal.

After the high-frequency signal is filtered by the low-pass filter, the remaining direct-current offset signal is:

$$V_{dc}^{mixTX} = \frac{B}{2} * [A_1 * \cos(\varphi_1 - \varphi_0) + A_2 * \cos(\varphi_2 - \varphi_0)]$$

The above formula shows that the two transmitted signals have the same frequency as the local oscillator signal of the receiving channel for calibration, and shows the remaining difference frequency signal after the high-frequency signal is filtered out in the receiving channel for calibration. The difference frequency signal in this case is a direct-current component which reaches a maximum value when initial phases of the two cosine signals are both the same as the initial phase of the local oscillator signal.

The direct-current offset signal generated after the mixing in the mixer is superposed with the initial system direct-current offset signal, and then, the direct-current offset signal measured at the output end of the ADC is recorded as $V_{dc}^{totTX}$. Since the initial system direct-current offset is to be subtracted from the direct-current offset generated by mixing on this basis, so $V_{dc}^{mixTX} = V_{dc}^{totTX} - V_{dc}^{initTX}$.

At S230, setting the optimization target to $V_{dc}^{mixTX}$, and respectively adjusting phases of the transmitting channels $TX_1$ and $TX_2$ (which may be specifically implemented by adjusting a phase shifter module in each transmitting channel), until the optimization target $V_{dc}^{mixTX}$ reaches a maximum value. The condition for $V_{dc}^{mixTX}$ reaching the maximum value is:

$$\begin{cases} \phi_1 = \phi_0 \\ \phi_2 = \phi_0 \end{cases} \quad (11)$$

The formula (11) shows that the condition for the direct-current component generated by mixing reaches the maximum value is that initial phases of the two transmitting channels are both the same as the initial phase of the local oscillator signal.

Therefore, the relationship is $\varphi_1 = \varphi_2 = \varphi_0$, thereby implementing phase calibration of each transmitting channel in the dual channel phased array system, and ensuring that all transmitting channels have a same initial phase.

At S240, adjusting initial phases of the two transmitting channels to the phases determined in operation S230.

The present disclosure provides an apparatus for determining a target initial phase, including: a memory module having a computer program stored thereon, and one or more processors which invoke the computer program to implement the method for determining a target initial phase according to the present disclosure.

The apparatus for determining a target initial phase may further include a read/write (I/O) interface connected between the one or more processors and the memory module to enable information interaction between the one or more processors and the memory module.

Each processor is a device with a data processing capability, including but not limited to a central processing unit (CPU) or the like; and the memory module is a device with a data storage capability, including but not limited to a random access memory (RAM, more specifically SDRAM, DDR, etc.), a read only memory (ROM), an electrically erasable programmable read only memory (EEPROM) or a flash memory (FLASH).

The I/O interface, including but not limited to a data bus, is connected between the processors and the memory module to enable information interaction between the processors and the memory module.

The processors, the memory module, and the I/O interface are interconnected via a bus, and thus are further connected to other components of the apparatus for determining a target initial phase.

The present disclosure provides a computer-readable storage medium having a computer program stored thereon which, when invoked by a processor, causes the processor to implement the method for determining a target initial phase according to the present disclosure.

Those of ordinary skill in the art will appreciate that all or some operations of the above described method, functional modules/units in the system and apparatus may be implemented as software, firmware, hardware, and suitable combinations thereof. In a hardware implementation, the division between the functional modules/units mentioned in the above description does not necessarily correspond to the division of physical components; for example, one physical component may have multiple functions, or one function or operation may be performed cooperatively by several physical components. Some or all physical components may be implemented as software executed by a processor, such as a CPU, a digital signal processor or microprocessor, or implemented as hardware, or implemented as an integrated circuit, such as an application specific integrated circuit. Such software may be distributed on a computer-readable medium which may include a computer storage medium (or non-transitory medium) and communication medium (or transitory medium). As is well known to those of ordinary skill in the art, the term computer storage medium includes volatile and nonvolatile, removable and non-removable medium implemented in any method or technology for storing information, such as computer-readable instructions, data structures, program modules or other data. A computer storage medium includes, but is not limited to, RAM, ROM, EEPROM, flash memory or other memory technology, CD-ROM, digital versatile disc (DVD) or other optical disc storage, magnetic cartridge, magnetic tape, magnetic disk storage or other magnetic storage devices, or may be any other medium used for storing the desired information and accessible by a computer. Moreover, it is well known to one of ordinary skill in the art that a communication medium typically includes a computer-readable instruction, a data structure, a program module, or other data in a modulated data signal, such as a carrier wave or other transport mechanism, and may include any information delivery medium.

The present disclosure provides an antenna device, including: a phased array system; and a target initial phase determining apparatus according to the present disclosure.

With the apparatus for determining a target initial phase, the phase calibration accuracy of each channel in the phased array system can be improved, thereby improving the beam forming performance of the antenna device.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A method for determining a target initial phase, comprising:

acquiring a voltage amplitude of a system direct-current offset signal of a phased array system corresponding to N target channels to be calibrated;

respectively acquiring voltage amplitudes of a total direct-current offset signal under different initial phases, wherein for any initial phase, the total direct-current offset signal is a total direct-current offset signal of an initial mixed signal output from a mixer downstream of a power combiner of the phased array system after test signals are provided for the N target channels; and calculating voltage amplitudes of a mixed direct-current offset signal of the N target channels under the different initial phases, and taking an initial phase of the N target channels, when the voltage amplitude of the mixed direct-current offset signal reaches the maximum value, as a target initial phase of the N target channels;

wherein the voltage amplitude of the mixed direct-current offset signal is calculated by:

$$V_{dc}^{mix} = V_{dc}^{tot} - V_{dc}^{int};$$

where $V_{dc}^{int}$ is the voltage amplitude of the system direct-current offset signal;

$V_{dc}^{tot}$ is the voltage amplitude of the total direct-current offset signal;

$V_{dc}^{mix}$ is the voltage amplitude of the mixed direct-current offset signal; and N is the number of channels in the phased array system.

2. The method for determining a target initial phase according to claim 1, wherein each of the target channels is a receiving channel, and in the operation of acquiring the voltage amplitude of the system direct-current offset signal of the phased array system corresponding to the N target channels to be calibrated, the voltage amplitude of the system direct-current offset signal is an output value of an analog-to-digital converter downstream of the mixer after the N receiving channels are opened.

3. The method for determining a target initial phase according to claim 2, wherein the test signals provided for the N target channels are single tone signals transmitted from a transmitter antenna of a single channel used for calibration, and in the operation of respectively acquiring the voltage amplitudes of the total direct-current offset signal under different initial phases, the voltage amplitude of the total direct-current offset signal is an output value of the analog-to-digital converter after the N receiving channels are opened.

4. The method for determining a target initial phase according to claim 1, wherein each of the target channels is a transmitting channel, and in the operation of acquiring the voltage amplitude of the system direct-current offset signal of the phased array system corresponding to the N target channels to be calibrated, the voltage amplitude of the system direct-current offset signal is an output value of an analog-to-digital converter downstream of the mixer after a receiving channel for calibration is opened.

5. The method for determining a target initial phase according to claim 4, wherein the test signals provided for the N target channels are single tone signals transmitted through a multi-channel transmitter antenna of the phased array system, and in the operation of respectively acquiring the voltage amplitudes of the total direct-current offset signal under different initial phases, the voltage amplitude of the total direct-current offset signal is an output value of the analog-to-digital converter after the receiving channel for calibration is opened.

6. A phase calibration method, comprising:

generating a system direct-current offset signal of a phased array system corresponding to N target channels to be calibrated, and outputting a voltage amplitude of the system direct-current offset signal;

adjusting initial phases of the N target channels, wherein each time the initial phases of the N target channels are adjusted to another phase value, test signals are provided for the N target channels so that a mixer downstream of a power combiner of the phased array system outputs a total direct-current offset signal, as well as a voltage amplitude of the total direct-current offset signal;

determining, according to the method for determining a target initial phase according to claims 1, a target initial phase of the N target channels; and respectively adjusting the initial phases of the target channels to the target initial phase.

7. The phase calibration method according to claim 6, wherein each of the target channels is a receiving channel, and the operation of generating the system direct-current offset signal of the phased array system corresponding to the N target channels to be calibrated, and outputting the voltage amplitude of the system direct-current offset signal comprises:

opening the N receiving channels; and taking an output value of an analog-to-digital converter of the phased array system as the voltage amplitude of the system direct-current offset signal.

8. The phase calibration method according to claim 7, wherein the operation of providing test signals for the N target channels so that the mixer downstream of the power combiner of the phased array system outputs the total direct-current offset signal, as well as the voltage amplitude of the total direct-current offset signal comprises:

transmitting single tone signals as the test signals through a single-channel transmitter antenna for calibration; and opening the N receiving channels, and taking the output value of the analog-to-digital converter as the voltage amplitude of the total direct-current offset signal.

9. The phase calibration method according to claim 6, wherein each of the target channels is a transmitting channel, and the operation of generating the system direct-current offset signal of the phased array system corresponding to the N target channels to be calibrated, and outputting the voltage amplitude of the system direct-current offset signal comprises:

opening a receiving channel for calibration; and taking an output value of an analog-to-digital converter of the phased array system as the voltage amplitude of the system direct-current offset signal.

10. The phase calibration method according to claim 9, wherein the operation of providing test signals for the N target channels so that the mixer downstream of the power combiner of the phased array system outputs the total direct-current offset signal, as well as the voltage amplitude of the total direct-current offset signal comprises:

transmitting single tone signals as the test signals through a multi- channel transmitter antenna; and opening the receiving channel for calibration, and taking an output value of an analog-to-digital converter downstream of the mixer as the voltage amplitude of the total direct-current offset signal.

11. An apparatus for determining a target initial phase, comprising:

a memory module having a computer program stored thereon, and one or more processors which invoke the computer program to implement the method for determining a target initial phase according to claims 1.

12. An antenna device, comprising:

a phased array system; and the apparatus for determining a target initial phase according to claim 11.

13. A non-transitory computer-readable storage medium having a computer program stored thereon which, when invoked by a processor, causing the processor to implement the method for determining a target initial phase according to claims 1.

* * * * *